US012376318B2

(12) United States Patent
Vavro

(10) Patent No.: US 12,376,318 B2
(45) Date of Patent: Jul. 29, 2025

(54) SEMICONDUCTOR DEVICES AND METHODS OF MANUFACTURING SEMICONDUCTOR DEVICES

(71) Applicant: SEMICONDUCTOR COMPONENTS INDUSTRIES, LLC, Phoenix, AZ (US)

(72) Inventor: Juraj Vavro, Rakovice (SK)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 716 days.

(21) Appl. No.: 17/649,106

(22) Filed: Jan. 27, 2022

(65) Prior Publication Data
US 2022/0302286 A1 Sep. 22, 2022

Related U.S. Application Data

(60) Provisional application No. 63/162,962, filed on Mar. 18, 2021.

(51) Int. Cl.
*H10D 12/00* (2025.01)
*H01L 21/04* (2006.01)
(Continued)

(52) U.S. Cl.
CPC ......... *H10D 12/441* (2025.01); *H10D 12/032* (2025.01); *H10D 62/393* (2025.01); *H01L 21/04* (2013.01)

(58) Field of Classification Search
CPC .................... H01L 29/66325–66348; H01L 29/7393–7398; H01L 2924/13055;
(Continued)

(56) References Cited

U.S. PATENT DOCUMENTS 9,093,522 B1 * 7/2015 Zeng ................. H01L 29/66348
2012/0315747 A1 12/2012 Mauder et al.
(Continued)

FOREIGN PATENT DOCUMENTS

| CN | 109219888 A | * | 1/2019 | ........... H01L 21/322 |
| DE | 112017000297 T5 | * | 11/2018 | ........... H01L 21/324 |
| EP | 3503204 A2 | * | 6/2019 | ....... H01L 21/02546 |

*Primary Examiner* — Jeff W Natalini
*Assistant Examiner* — Andrew Zabel
(74) *Attorney, Agent, or Firm* — Kevin B. Jackson

(57) ABSTRACT

In an example, a semiconductor device includes a cathode region having a first conductivity type and a cathode region dopant concentration. A charge storage region overlies the cathode region and has the first conductivity type and a charge storage region dopant concentration less than the cathode region dopant concentration. A buffer region overlies the charge storage region and has the first conductivity type, a buffer region thickness, a buffer region dopant concentration profile, and a buffer region peak dopant concentration. A drift region overlies the buffer region and has the first conductivity type and a drift region dopant concentration. An anode region of a second conductivity type opposite to the first conductivity type is adjacent to the drift region. The buffer region peak dopant concentration is greater than the charge storage region dopant concentration and greater than the drift region dopant concentration. The buffer region peak dopant concentration is spaced apart from the charge storage region and spaced apart from the drift region. Other related examples and methods are disclosed herein.

20 Claims, 6 Drawing Sheets

(51) Int. Cl.
*H10D 12/01* (2025.01)
*H10D 62/17* (2025.01)

(58) Field of Classification Search
CPC . H01L 29/083–0834; H01L 29/66333–66348; H01L 29/7395–7398; H01L 29/663; H01L 29/7398; H01L 29/66348; H01L 29/7428; H01L 27/0617–0635; H01L 27/0705–0738; H01L 27/088–0883
See application file for complete search history.

(56) References Cited

U.S. PATENT DOCUMENTS

| | | | |
|---|---|---|---|
| 2013/0277793 A1 | 10/2013 | Lee et al. | |
| 2016/0027867 A1* | 1/2016 | Matsushita | H01L 29/0619 |
| | | | 257/140 |
| 2017/0117397 A1* | 4/2017 | Mauder | H01L 29/7397 |
| 2018/0097093 A1* | 4/2018 | Pfirsch | H01L 29/0696 |

* cited by examiner

10    FIG. 3
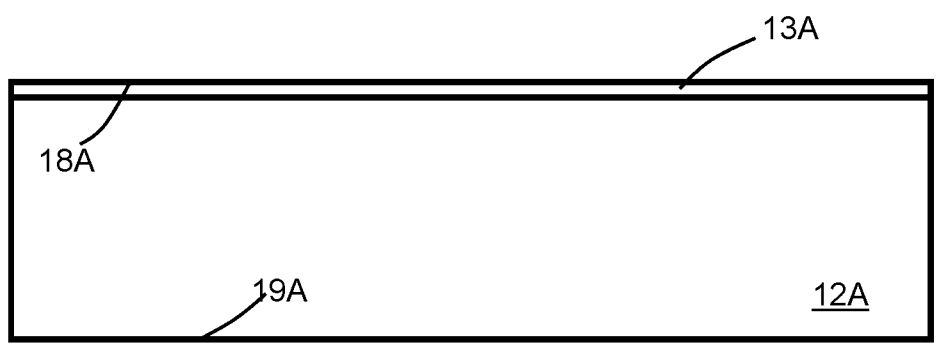
10    FIG. 4

SEMICONDUCTOR DEVICES AND METHODS OF MANUFACTURING SEMICONDUCTOR DEVICES

CROSS-REFERENCE TO RELATED APPLICATIONS

This application claims priority from U.S. Provisional Application No. 63/162,962 filed on Mar. 18, 2021, which is hereby incorporated by reference in its entirety.

TECHNICAL FIELD

The present disclosure relates, in general, to electronics and, more particularly, to semiconductor device structures and methods of forming semiconductor devices.

BACKGROUND

Prior semiconductor devices and methods for forming semiconductor devices are inadequate, for example resulting in excess cost, inadequate integration, decreased reliability, relatively low performance, or dimensions that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 3, 4, 5, 6, 7, and 8 are partial cross-sectional views illustrating a semiconductor device at various stages of fabrication in accordance with a method of the present description;

Figure 1:
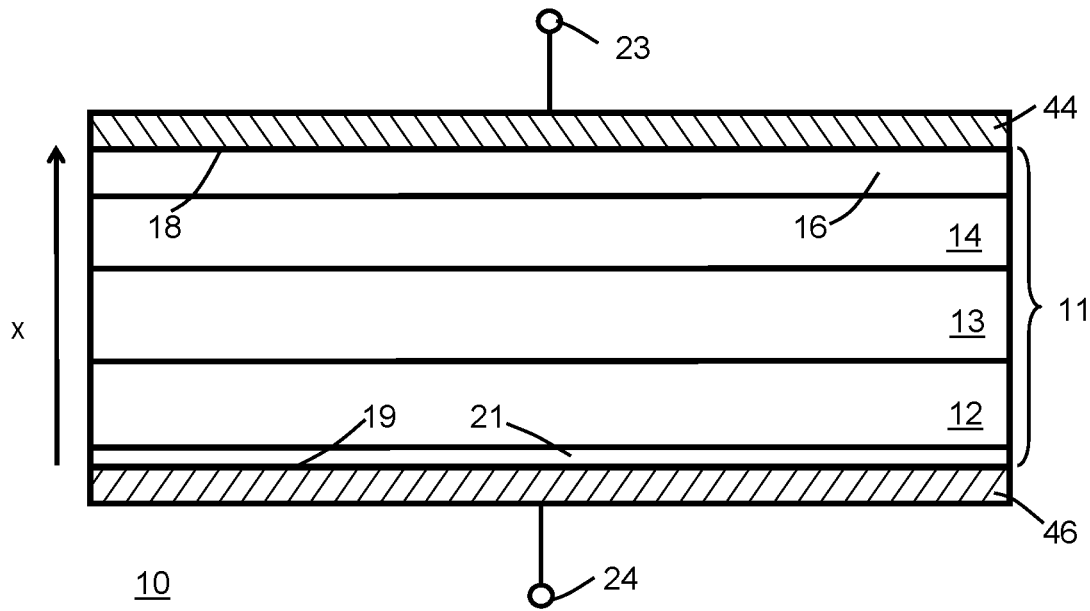
FIG. 1 illustrates a partial cross-sectional view of a semiconductor device in accordance with the present description.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

For simplicity and clarity of the illustration, elements in the figures are not necessarily drawn to scale, and the same reference numbers in different figures denote the same elements. Additionally, descriptions and details of well-known steps and elements are omitted for simplicity of the description.

For clarity of the drawings, certain regions of device structures, such as doped regions or dielectric regions, may be illustrated as having generally straight-line edges and precise angular corners. However, those skilled in the art understand that, due to the diffusion and activation of dopants or formation of layers, the edges of such regions generally may not be straight lines and that the corners may not be precise angles.

Although the semiconductor devices are explained herein as certain N-type conductivity regions and certain P-type conductivity regions, a person of ordinary skill in the art understands that the conductivity types can be reversed and are also possible in accordance with the present description, taking into account any necessary polarity reversal of voltages, inversion of transistor type and/or current direction, etc.

In addition, the terminology used herein is for the purpose of describing particular examples only and is not intended to be limiting of the disclosure. As used herein, the singular forms are intended to include the plural forms as well, unless the context clearly indicates otherwise.

As used herein, "current-carrying electrode" means an element of a device that carries current through the device, such as a source or a drain of an MOS transistor, an emitter or a collector of a bipolar transistor, or a cathode or anode of a diode, and a "control electrode" means an element of the device that controls current through the device, such as a gate of a MOS transistor or a base of a bipolar transistor.

The term "major surface" when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions.

The terms "comprises", "comprising", "includes", and/or "including", when used in this description, are open ended terms that specify the presence of stated features, numbers, steps, operations, elements, and/or components, but do not preclude the presence or addition of one or more other features, numbers, steps, operations, elements, components, and/or groups thereof.

The term "or" means any one or more of the items in the list joined by "or". As an example, "x or y" means any element of the three-element set $\{(x), (y), (x, y)\}$. As another example, "x, y, or z" means any element of the seven-element set $\{(x), (y), (z), (x, y), (x, z), (y, z), (x, y, z)\}$.

Although the terms "first", "second", etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure.

It will be appreciated by one skilled in the art that words, "during", "while", and "when" as used herein related to circuit operation are not exact terms that mean an action takes place instantly upon an initiating action but that there may be some small but reasonable delay, such as propagation delay, between the reaction that is initiated by the initial action. Additionally, the term "while" means a certain action occurs at least within some portion of a duration of the initiating action.

The use of word "about", "approximately", or "substantially" means a value of an element is expected to be close to a state value or position. However, as is well known in the art there are always minor variances preventing values or positions from being exactly stated.

Unless specified otherwise, as used herein, the word "over" or "on" includes orientations, placements, or relations where the specified elements can be in direct or indirect physical contact.

Unless specified otherwise, as used herein, the word "overlapping" includes orientations, placements, or relations where the specified elements can at least partly or wholly coincide or align in the same or different planes.

It is further understood that the examples illustrated and described hereinafter suitably may have examples and/or may be practiced in the absence of any element that is not specifically disclosed herein.

DETAILED DESCRIPTION OF THE DRAWINGS

Insulated-gate bipolar transistors (IGBTs) are three terminal semiconductor devices often used in electronic switching applications. IGBTs utilize a four-layer diode (e.g., P—N—P—N) structure, which is controlled by a metal-oxide-semiconductor (MOS) gate. IGBTs provide high efficiency and fast switching performance. In some applications, a high voltage diode can be co-packaged with an IGBT to promote high-speed switching with low switching losses, a low forward voltage ($V_f$) and low conduction losses. In addition, soft switching behavior can be achieved with lower voltage overshoot and without oscillations to suppress electromagnetic interference (EMI). Past approaches to high voltage diode design for IGBT applications have resulted in high material costs, co-packaging inefficiencies, and less than preferred electrical performance.

In general, the present examples relate to semiconductor device structures and methods of making semiconductor devices, such as high voltage diodes that utilize high resistivity substrates with selectively doped buffer regions and reduced thickness epitaxial layers. In some examples, the semiconductor devices utilize a buffer region formed using ion implantation into a high resistivity substrate with a thin epitaxial layer (for example, 40 microns for a 750 volt device or 80 microns for a 1200 volt device) formed overlying the buffer region and the high resistivity substrate. The configurations were found in practice with 750 volt and 1200 volt diode structures to reduce substrate costs, improve switching softness without significantly impacting $V_f$, allow for higher speed switching and reduced switching losses, and provide die with die thicknesses comparable with current and next generation IGBT die (including fast switching IGBT die) to improve co-packaging efficiencies.

In an example, a semiconductor device includes a semiconductor workpiece. The semiconductor workpiece includes a semiconductor workpiece top side; a semiconductor workpiece bottom side opposite to the semiconductor workpiece top side; a first region at the semiconductor workpiece bottom side and having a first conductivity type and a first region dopant concentration; a second region adjacent to the first region and having the first conductivity type and a second region dopant concentration; a third region adjacent to the second region and having the first conductivity type and a third region dopant concentration profile over a thickness of the third region with a third region peak dopant concentration; and a fourth region adjacent to the third region and having the first conductivity type and a fourth region dopant concentration. The third region peak dopant concentration is greater than the second region dopant concentration and the fourth region dopant concentration. A fifth region is at the semiconductor workpiece top side adjacent to the fourth region and has a second conductivity type opposite to the first conductivity type. A first conductor is connected to the fifth region adjacent to the semiconductor workpiece top side. A second conductor is connected to the first region adjacent to the semiconductor workpiece bottom side.

In an example, a semiconductor device includes a cathode region having a first conductivity type and a cathode region dopant concentration. A charge storage region overlies the cathode region and has the first conductivity type and a charge storage region dopant concentration less than the cathode region dopant concentration. A buffer region overlies the charge storage region and has the first conductivity type, a buffer region thickness, a buffer region dopant concentration profile with a buffer region peak dopant concentration. A drift region overlies the buffer region and has the first conductivity type and a drift region dopant concentration. An anode region of a second conductivity type opposite to the first conductivity type is adjacent to the drift region. The buffer region peak dopant concentration is greater than the charge storage region dopant concentration and greater than the drift region dopant concentration, and the buffer region peak dopant concentration is spaced apart from the charge storage region and spaced apart from the drift region.

In an example, a method of manufacturing a semiconductor device includes providing a semiconductor substrate having a substrate top side, a substrate bottom side opposite to the substrate top side, a first conductivity type, and a substrate dopant concentration. The method includes forming a buffer region of the first conductivity type adjacent to the semiconductor substrate top side. The method includes forming a drift region of the first conductivity type over the buffer region, wherein the buffer region has a buffer region thickness, a buffer region dopant concentration profile, and a peak dopant concentration; and the drift region has a drift region dopant concentration less than the buffer peak dopant concentration. The method includes forming an anode region of a second conductivity type within the drift region. The method includes removing a portion of the semiconductor substrate from the substrate bottom side to provide a substrate thinned bottom side. The method includes forming a cathode region of the first conductivity type at the substrate thinned bottom side and having a cathode region peak dopant concentration, wherein part of the semiconductor substrate between the cathode region and the buffer region forms a charge storage region that has the substrate dopant concentration, and the buffer region peak dopant concentration is greater than the substrate dopant concentration.

Other examples are included in the present disclosure. Such examples may be found in the figures, in the claims, or in the description of the present disclosure.

Figure 10:
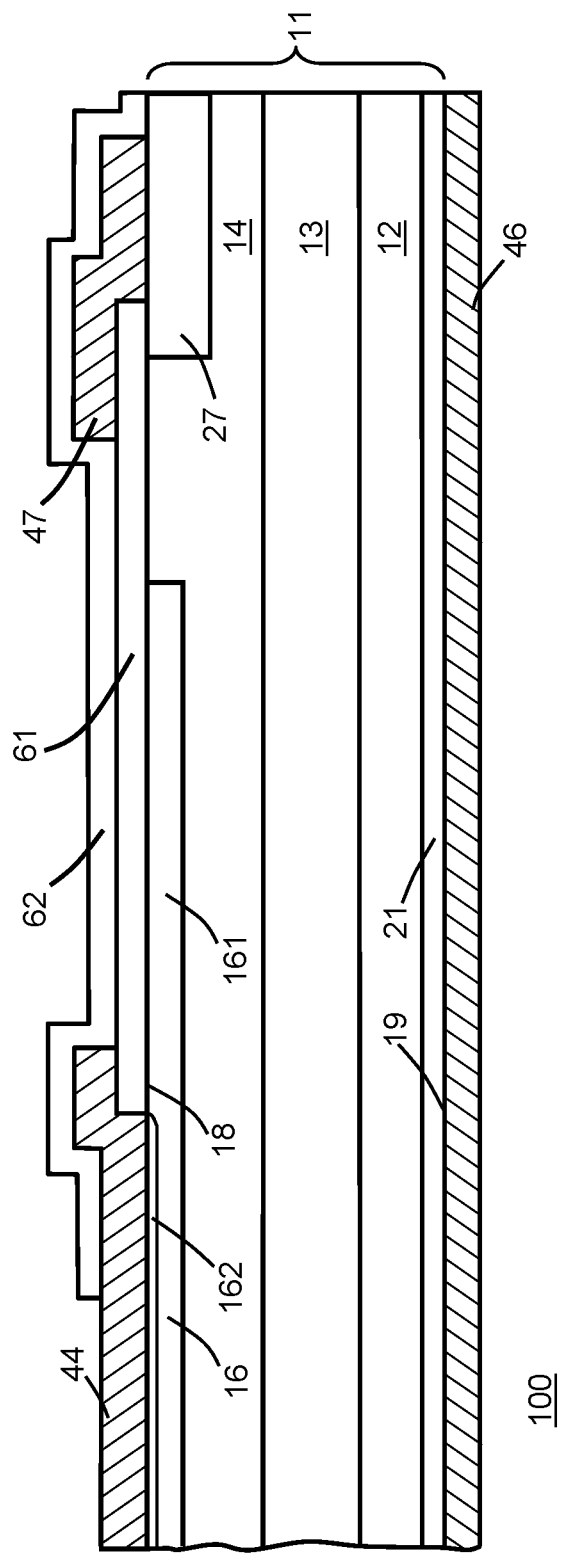
FIG. 10 illustrates a partial cross-sectional view of a semiconductor device in accordance with the present description.

FIG. 1 illustrates a partial cross-sectional view of a semiconductor device 10 in accordance with the present description. Semiconductor device 10 is illustrated in a simplified one-dimensional form to not distract from the present description and is illustrated as a soft recovery high voltage diode. A semiconductor device 100 in accordance with the present description, which includes a two-dimensional example of a non-limiting termination structure, is illustrated in FIG. 10, and will be described later.

Semiconductor device 10 includes a semiconductor workpiece 11, which can include various semiconductor regions, portions, parts, layers, and a semiconductor substrate provided in various combinations and structural sequences. In one example, semiconductor workpiece 11 includes a semiconductor substrate with regions formed within the semiconductor substrate and regions formed overlying the semiconductor substrate. The regions overlying the semiconductor substrate can be regions or layers that overlie other regions layers, or they can be regions that are within other regions. Semiconductor workpiece 11 can also be referred to as a region of semiconductor material. Semiconductor workpiece 11 has a top side 18 and a bottom side 19 that is opposite to top side 18.

In some examples, semiconductor workpiece 11 includes a cathode region 21 adjacent to bottom side 18 and a charge storage region 12 adjacent to or overlying cathode region 21. In the present example, cathode region 21 and charge storage region 12 have an N-type conductivity type and cathode region 21 has a higher dopant concentration than the dopant concentration of charge storage region 12. Charge storage region 12 has a charge storage region thickness and a charge storage region dopant concentration. In accordance with the present description, charge storage region 12 is provided as part of a semiconductor substrate 12A (illustrated in FIG. 3) such that the charge storage region dopant concentration is determined or established by the dopant concentration or resistivity of semiconductor substrate 12A.

In some examples, semiconductor substrate 12A is a high resistivity N-type conductivity type substrate with a resistivity in a range from about 55 ohm-cm to about 140 ohm-cm. In some examples, a resistivity of about 80 ohm-cm to about 115 ohm-cm is used for semiconductor substrate 12A. In other examples, a resistivity of about 85 ohm-cm is used for semiconductor substrate 12A. In some examples, semiconductor substrate 12A is a silicon substrate with a (111) orientation, but other orientations can be used. In other examples, semiconductor substrate 12A can comprise other semiconductor materials including for example, IV-IV semiconductor materials or III-V semiconductor materials.

In accordance with the present description, charge storage region 12 is configured to provide carriers for a tail current during a final phase of reverse recovery of semiconductor device 10, and is configured to further support a high blocking voltage when semiconductor device 10 is close to or above its rated operating voltage (e.g., above rated bus voltage). More particularly, charge storage region 12 is not configured as a field stop region and can be used to support the reverse blocking capability of semiconductor device 10 under the conditions described above.

In accordance with the present description, cathode region 21 extends inward from bottom side 19 into semiconductor workpiece 11 (e.g., into semiconductor substrate 12A) to a shallow depth. In some examples, this depth or charge cathode region thickness can be 0.5 microns to 1.5 microns. In some examples, the depth can be less than 0.5 microns or greater than 1.5 microns. In this configuration, cathode region 21 is the lower-most region of semiconductor device 10, Cathode region 21 is configured for providing ohmic contact with a terminal 46, and in accordance with the present description, cathode region 21 can be used as a field-stop region when, for example, semiconductor device 10 is biased above the specified bus voltage rating.

In some examples, cathode region 21 can be referred to as a first region of semiconductor device 10 and the charge storage region 12 can be referred to as a second region of semiconductor device 10. In the present example, both cathode region 21 and charge storage 12 are within or are part of semiconductor substrate 12A with charge storage region 12 adjacent to, above, or overlying cathode region 21. As will be described later, cathode region 21 can be formed in semiconductor substrate 12A after it is subjected to a wafer thinning process that removes material from the back side of semiconductor substrate 12A to form bottom side 19 of semiconductor workpiece 11.

Semiconductor device 10 includes a buffer region 13 adjacent to, above or overlying charge storage region 12. In accordance with the present description, buffer region 13 has an N-type conductivity type, a buffer region thickness, and a selected dopant profile over the buffer region thickness that has a peak dopant concentration. As illustrated in FIG. 1, buffer region 13 is spaced apart from cathode region 21 with charge storage region 12 interposed between buffer region 13 and cathode region 21. In some examples, the buffer region thickness can be in a range from about 25 microns to about 60 microns. In other examples, the buffer region thickness can be in a range from about 35 microns to about 45 microns. In further examples, the buffer region thickness can be in a range from 41 to 43 microns. In accordance with the present description, the peak dopant concentration of buffer region 13 is greater than the dopant concentration of charge storage region 12.

In accordance with the present description, buffer region 13 is configured to slow the depletion region expansion in semiconductor device 10, and to reduce the likelihood that the depletion region expands into charge storage region 12 when semiconductor device 10 is under a reverse bias at the rated bus voltage (e.g., during standard switching operation). In accordance with the present description, this configuration facilitates the prevention of unwanted carrier extraction of carriers stored in charge storage region 12 by the reverse bias electric field thus reducing any drift current (which has a high dI/dt). Instead, carriers stored in charge storage region 12 are extracted by diffusion to an edge of the depletion region as diffusion current (which has a low NM). In addition, buffer region 13 is configured such that the depletion region of semiconductor device 10 can expand into charge storage region 12 at reverse bias conditions above the rated bus voltage and the high resistivity of charge storage region 12 further supports a high blocking voltage of semiconductor device 10.

In some examples, a portion or part of buffer region 13 is within or is a part of semiconductor substrate 12A, which will be further described in conjunction with FIGS. 3-6. In some examples, a substantial portion of buffer region 13 is within semiconductor substrate 12A. In some examples, the buffer region can be expand into semiconductor substrate 12A in a range from about 10 microns to about 25 microns In some examples, buffer region 13 can be referred to as a third region of semiconductor device 10.

Semiconductor device 10 includes a drift region 14 adjacent to, above or overlying buffer region 13. In some examples, drift region 14 has an N-type conductivity type, a drift region thickness, and a drift region dopant concentration and profile. In accordance with the present description, buffer region 14 is an epitaxial layer formed using epitaxial growth techniques and can be doped in accordance with a selected or predetermined dopant concentration profile during the epitaxial growth process. This can be referred to as an as-formed region, which is different from regions that are doped using other techniques, such as ion implantation, spin-on doping, or chemical vapor deposition doping followed by diffusion to provide the dopant profile. As will be described later, drift region 14 is formed over semiconductor substrate 12A after dopant for buffer region 13 is provided within semiconductor substrate 12A. For example, dopant can be ion implanted into semiconductor substrate 12A.

In accordance with the present description, the drift region thickness and drift region dopant concentration and profile are selected to achieve the blocking voltage requirements of semiconductor device 10 in conjunction with the features of buffer region 13 and charge storage region 12. In accordance with the present description, the features of buffer region 13 and charge storage region 12 facilitate drift regions that are thinner than previous devices, which can save on material costs and further improve electrical performance, such as lower $V_f$.

In accordance with the present description, the drift region dopant concentration is less than the peak dopant concentration of buffer region 13. In some examples, the as-formed drift region thickness can be in range from about 35 microns to about 45 microns and drift region 14 can have a resistivity in a range from about 70 ohm-cm to about 90 ohm-cm. In some examples, drift region 14 has a resistivity of about 80 ohm-cm. It is understood that the final drift thickness 14 can be set by the out-diffusion of buffer region 13 and the placement of an anode region 16 of semiconductor device 10 within or overlying drift region 14. In some examples, the dopant concentration of drift region 14 can be substantially constant over the drift region thickness. In other examples, the dopant concentration can vary across the drift region thickness. Drift region 14 can be referred to as a fourth region, and in some examples, drift region 14 defines a top side 18 of semiconductor workpiece 11. In other examples, anode region 16 defines top side 18 of semiconductor workpiece 11. In the examples where drift region 18 defines top side 18, anode region 16 is provided within drift region 14. In examples where anode region 16 defines top side 18, anode region 16 can be provided overlying drift region 14.

As described previously, anode region 16 can be adjacent to, above, overlying, or within drift region 14. Anode region 16 has a P-type conductivity type and, in some examples, extends inward from top side 18 into drift region 14 to an anode region depth in a range from about 3 microns to about 15 microns. Anode region 16 forms a PN junction with drift region 14. In some examples, anode region 16 has a dopant concentration between $1 \times 10^{16}$ atoms/cm$^3$ and $1 \times 10^{17}$ atoms/cm$^3$. In some examples, anode region 16 can be referred to as a fifth region of semiconductor device 10.

Although not illustrated, semiconductor device 10 can further include a P-type conductivity enhancement region adjacent to, above, overlying, or within anode region 16 to provide ohmic contact to terminal 44, which is provided over semiconductor workpiece 11 and connected to anode region 16. Terminal 44 provides an anode terminal or contact 23 for semiconductor device 10. A terminal 46 is provided adjacent lower surface 19 and is connected to cathode region 21. Terminal 46 provides a cathode terminal or contact 24 for semiconductor device 10. To provide a forward bias to semiconductor device 10, a positive bias is applied to anode terminal 23 and a negative bias is applied to cathode terminal 24. To reverse bias semiconductor device 10, the biases are reversed. Terminal 44 and terminal 46 may also be referred to a first conductor and a second conductor respectively.

Figure 2:
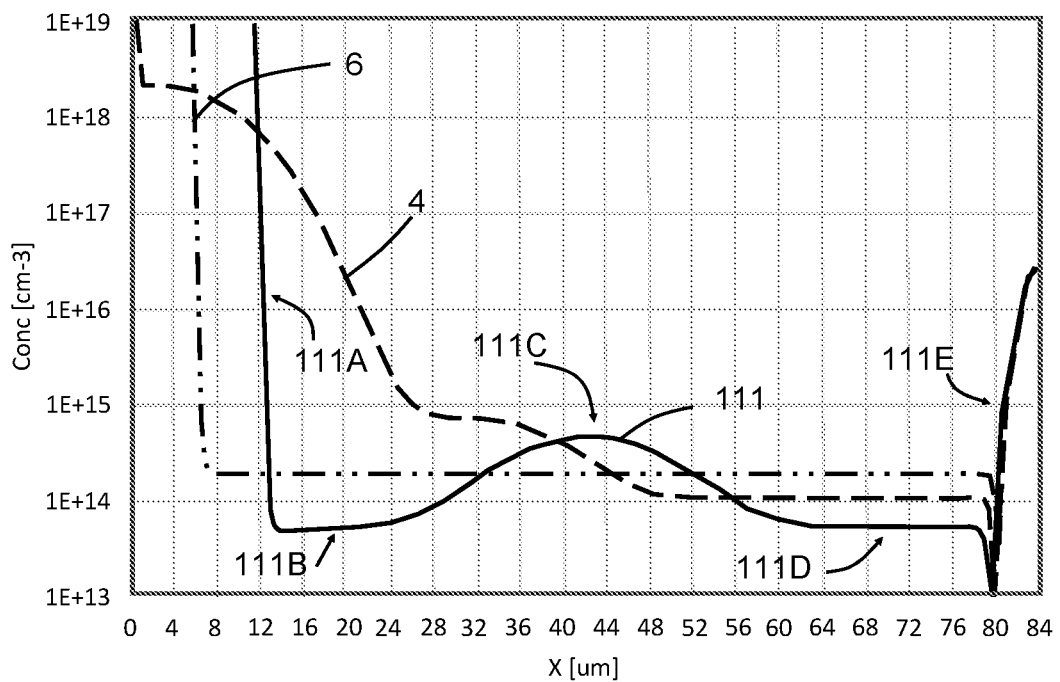
FIG. 2 illustrates graphical information related to dopant concentration profiles for semiconductor devices including a semiconductor device in accordance with the present description.

Referring now to FIG. 2, which illustrates graphical information related to dopant concentration profiles for semiconductor devices, which includes an example dopant concentration profile 111 for semiconductor workpiece 11 of semiconductor device 10 in accordance with the present description. The Y-axis of FIG. 2 corresponds to carrier concentration in atoms/cm$^3$, and the X-axis corresponds distance or depth in microns related to general region locations within semiconductor workpiece 11. The origin of the X-axis corresponds to the bottom or lower side of semiconductor workpiece 11 as illustrated by the X arrow in FIG. 1, and the distance to the right on the X-axis corresponds to regions up to the top or upper side of semiconductor workpiece 11. That is, in FIG. 2 cathode region 21 is proximate to the origin of the X-axis and anode region 16 is at the far right of the X-Axis.

In FIG. 2, dopant concentration profile 111 corresponds to an example of a dopant concentration profile for semiconductor workpiece 11 in accordance with the present description. Dopant concentration profile 4 corresponds to a prior approach that used multiple epitaxial layers on a low resistivity substrate (less than 0.002 ohm-cm) where a lower epitaxial layer has a lower resistivity to provide softer switching and an upper epitaxial layer has a higher resistivity to support high blocking voltage. The low resistivity substrate is thinned to provide a cathode region. Disadvantages of this approach included, among other things, use of very thick epitaxial layers (as thick as 120 microns or more), which increased manufacturing costs and manufacturing difficulties associated with thinning the low resistivity substrate in a controlled manner. In addition, this approach resulted in a diode die that was thicker than desired for co-packaging with next generation IGBT die.

Dopant concentration profile 6 corresponds to a prior approach that used a non-punch through (NPT) configuration, which used a float-zone substrate where the drift region was defined by a wafer thinning process and the cathode was formed by doping the back side of the thinned float-zone substrate. The float-zone substrate provided some soft-switching capability but with a trade-off to support blocking voltage requirements. This approach resulted in a diode with increased $V_f$ and switching losses due to a greater drift region thickness, which resulted in increased power losses. In addition, this approach resulted in a diode die that was thicker than desired for co-packaging with next generation IGBT die.

In dopant concentration profile 111, portion 111A corresponds to the dopant concentration profile portion for cathode region 21, portion 111B corresponds to the dopant concentration profile portion for charge storage region 12, portion 111C corresponds to the dopant concentration profile portion for buffer region 13, portion 111D corresponds to the dopant concentration profile portion for drift region 14, and portion 111E corresponds to the dopant concentration profile portion for anode region 16.

In accordance with the present description, charge storage region 12 can have a dopant concentration between $1.0 \times 10^{13}$ atoms/cm$^3$ and $1.0 \times 10^{14}$ atoms/cm$^3$. In some examples, charge storage region 12 can have a thickness of about 10 microns to about 50 microns. In some examples, dopant concentration profile 111C for buffer region 13 has a bell curve shape as illustrated in FIG. 2. In some examples, buffer region 13 has a peak dopant concentration that is substantially located at a central portion of the thickness of buffer region 13 as generally illustrated in FIG. 2. In some examples, the peak dopant concentration is greater than $1.0 \times 10^{14}$ atoms/cm$^3$ and less than $2.0 \times 10^{15}$ atoms/cm$^3$. In other examples, the peak dopant concentration is less than $1.0 \times 10^{15}$ atoms/cm$^3$. In some examples, dopant concentration profile 111C has a dopant concentration that is less than $1.0 \times 10^{14}$ atoms/cm$^3$ proximate to where it transitions to drift region 14 and a dopant concentration that is less than $1.0 \times 10^{14}$ atoms/cm$^3$ proximate to where it transitions to charge storage region 12. In accordance with the present description, buffer region 13 has a peak dopant concentration that is greater than the dopant concentration of charge storage region 12 and greater than the dopant concentration of drift region 14. In some examples, buffer region 13 has a peak dopant concentration of about $5.0 \times 10^{14}$ atoms/cm$^3$ to about $6.0 \times 10^{14}$ atoms/cm$^3$. In some examples, the dopant concentration of drift region 14 is greater than the dopant concentration of charge storage region 12. In some examples, the peak dopant concentration of buffer region 13 is located at a central portion of the thickness of the buffer region 13. In some examples, buffer region 13 has a single peak dopant concentration and does not have multiple peak dopant concentration across its thickness.

In accordance with the present description, some of the features of semiconductor device 10 include the use of a charge storage region 12 as part of semiconductor substrate 12A with a dopant concentration less than $1 \times 10^{14}$ atoms/cm$^3$. Charge storage region 12 is not configured to function as a field-stop layer but is configured to support reverse blocking capability of semiconductor device 10 at reverse bias conditions above the rated bus voltage. Charge storage region 12 further functions as a charge storage region that provides carriers to the tail current during the reverse recovery of semiconductor device 10 within the rated bus voltage rating. Semiconductor device 10 uses a thinner drift region 14 because buffer region 13 and charge storage region 12 are designed not to stop the depletion region of semiconductor device 10 during reverse bias operation above the rated bus voltage. Since drift region 13 is not configured as a field stop layer, the peak dopant concentration of buffer region 13 is less than conventional field stop layers, which typically have dopant concentration greater than $5.0 \times 10^{15}$ atoms/cm$^3$ to $1.0 \times 10^{17}$ atoms/cm$^3$. More particularly, in accordance with the present description buffer region 13 has a total integrated N-type charge that is less than about $1.5 \times 10^{12}$ atoms/cm$^2$ to facilitate electric field spread through buffer region 13 into charge storage region 12. In some examples, this can be achieved using an ion implantation dose of in a range from about $4.0 \times 10^{11}$ atoms/cm$^2$ to about $8.0 \times 10^{11}$ atoms/cm$^2$ for buffer region 13 during fabrication.

In addition, prior devices used low resistivity substrates that prevented the depletion region from reaching the cathode region. Semiconductor device 10 uses a higher resistivity charge storage region 12 that facilitates the depletion region expanding to cathode region 21 under high reverse bias conditions. Moreover, in accordance with the present description semiconductor device 10 does not utilize proton irradiation processing in an attempt to create a buffer region having complex dopant concentration profiles with multiple narrow width (for example, less than 2 to 3 micron widths) concentration peaks. As a result, semiconductor device 10 provides, among other things, a lower starting substrate cost, improved switching softness with acceptable $V_f$ performance, avoids complex proton irradiation and other complex processes, and supports switching at higher speeds and reduces switching losses. In addition, semiconductor device 10 supports a die thickness that more closely matches the thickness of current and next generation IGBT die, which supports co-packaging requirements.

FIGS. 3, 4, 5, 6, 7, and 8 are partial cross-sectional views illustrating a semiconductor device, such as semiconductor device 10 at various stages of fabrication in accordance with a method of the present description.

FIG. 3 illustrates semiconductor substrate 12A, which includes a substrate top side 18A and a substrate bottom side 19A opposite to substrate top side 18A. As described previously, semiconductor substrate 12A is a high resistivity N-type conductivity type substrate with a resistivity in range from about 55 ohm-cm to about 115 ohm-cm. In some examples, a resistivity of about 80 ohm-cm to about 90 ohm-cm is used. In other examples, a resistivity of about 85 ohm-cm is used. In some examples, semiconductor substrate 12A is a silicon substrate, but as described previously, other semiconductor materials can be used.

FIG. 4 illustrates semiconductor substrate 12A of semiconductor device 10 after additional processing. In accordance with the present description, N-type dopants are introduced into substrate top side 18A to an initial doping 13A for buffer region 13. In some examples, high energy ion implantation is used to provide initial doping 13A. In some examples, phosphorous ion implantation is used at an implant energy in a range from about 100 keV to about 5000 keV and an implantation does from about $3.0 \times 10^{11}$ atoms/cm$^2$ to about $9.0 \times 10^{11}$ atoms/com$^2$. In some examples, the ion implantation dose is selected to provide a peak dopant concentration for buffer region 13 of about $5.5 \times 10^{14}$ atoms/cm$^3$. The high energy ion implant can provide initial doping 13A with a depth into semiconductor substrate 12A of about 0.2-4.0 microns. It is understood that other N-type dopants such as arsenic or antimony can be used, but phosphorous is preferred in some examples because it has a greater penetration depth into semiconductor substrate 12A and larger diffusion coefficient compared to arsenic and antimony. In other examples, multiple ion implantation doses and/or energies can be used to provide initial doping 13A. In subsequent processing steps and depending on the total thermal budget for manufacturing semiconductor device 10, initial doping 13A can continue to diffuse into semiconductor substrate 12A and into drift region 14 to form buffer region 13. That is, buffer region 13 can be within both semiconductor substrate 12A and drift region 14.

Figure 5:
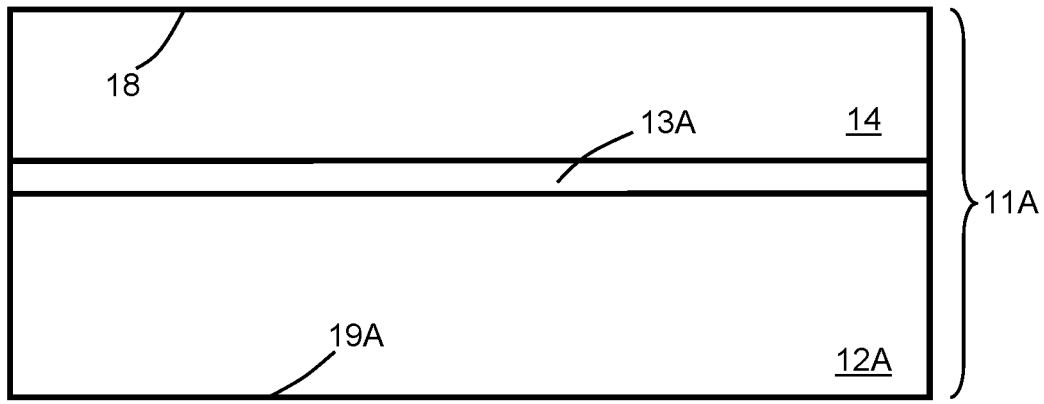

FIG. 5 illustrates semiconductor device 10 after further processing. In accordance with the present description, drift region 14 is formed on or overlying substrate top side 18A of semiconductor substrate 12A and initial doping 13A using epitaxial growth techniques. In some examples, drift region 14 is doped with an N-type conductivity dopant during the epitaxial growth process to provide an as-formed dopant concentration profile. In some examples, phosphorous can be used. In other examples, arsenic or antimony can be used. The thickness and dopant concentration of drift region 14 is selected in combination with charge storage region 12 and buffer region 13 to achieve the blocking voltage requirements of semiconductor device 10. In accordance with the present description, the drift region dopant concentration is less than the peak dopant concentration of buffer region 13. In some examples, the drift region thickness can be in range from about 35 microns to about 45 microns and drift region 14 can have a resistivity in a range from about 70 ohm-cm to about 90 ohm-cm. In some examples, drift region 14 has a resistivity of about 80 ohm-cm. As illustrated in FIG. 5, semiconductor substrate 12A, initial doping 13A, and drift region 14 provide an intermediate semiconductor workpiece 11A, which has a top side 18 defined by drift region 14. As stated previously, initial doping 13A may diffuse into drift region 14 and into semiconductor substrate 12A during the epitaxial growth process as well as during subsequent thermal processes.

Figure 6:
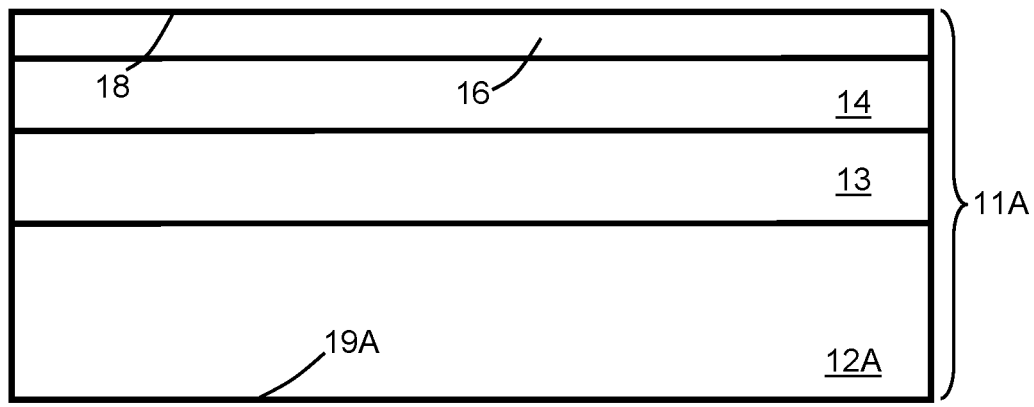

FIG. 6 illustrates semiconductor device 10 after additional processing. In some examples, anode region 16 is formed in top side 18 of intermediate semiconductor workpiece 11A. In the present example, anode region 16 has a P-type conductivity type and can be formed using ion implantation, chemical vapor deposition, spin-on, or other doping techniques as known to one of ordinary skill in the art. Diffusion or anneal techniques can be used to diffuse the P-type dopant to the required depth within drift region 14. In some examples, anode region 16 extends inward from top side 18 into drift region 14 to an anode region depth in a range from about 3 microns to about 15 microns. Anode region 16 forms a PN junction with drift region 14. In some examples, anode region 16 has a dopant concentration between $1\times10^{16}$ atoms/cm3 and $1\times1017$ atoms/cm3. Although not shown, a P-type enhancement region can be provided in a portion of anode region 16 for improving ohmic contact to terminal 44, which is described next.

Figure 7:
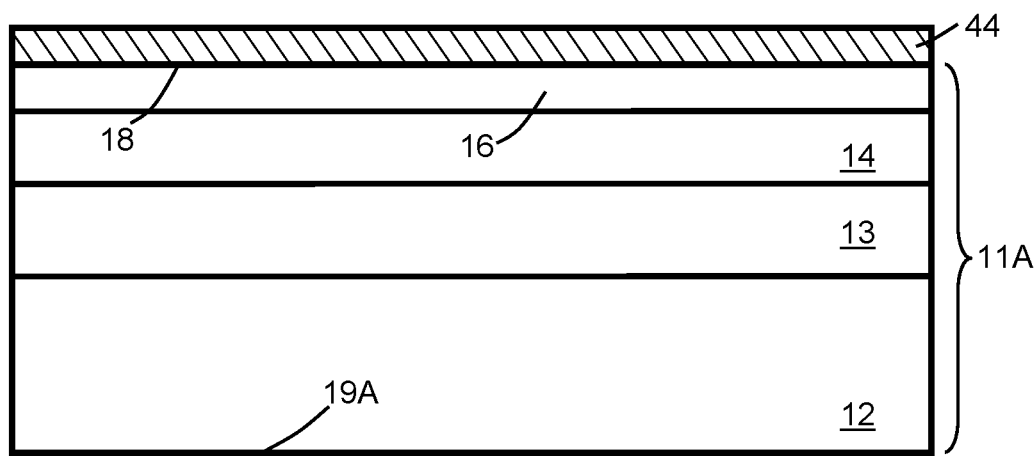

FIG. 7 illustrates semiconductor device 10 after further processing. In some examples, intermediate semiconductor workpiece 11A is subjected to a lifetime reduction process, such as a platinum doping process or other lifetime reduction processes as known to one of ordinary skill in the art. In some examples, terminal 44 is then formed over top side 18 of intermediate semiconductor workpiece 11A. The material for terminal 44 can be selected based on the packaging requirements for semiconductor device 10, such as the device interconnect requirements. In some examples, terminal 44 comprises one or more metals or metal layers. In some examples, terminal 44 can comprise an aluminum alloy, such as aluminum (Al)-silicon (Si)-copper (Cu) alloy. In some examples, a solderable material or sintering material is provided over the aluminum alloy. In other examples, terminal 44 can comprise titanium (Ti) nickel (Ni) silver (Ag) or chromium (Cr) Ni gold (Au). Terminal 44 can be formed using evaporation, sputtering, or other deposition techniques. In some examples, terminal 44 has a thickness between about 3 micron and 9 microns, Terminal 44 provides anode contact 23 for semiconductor device 10.

Figure 8:
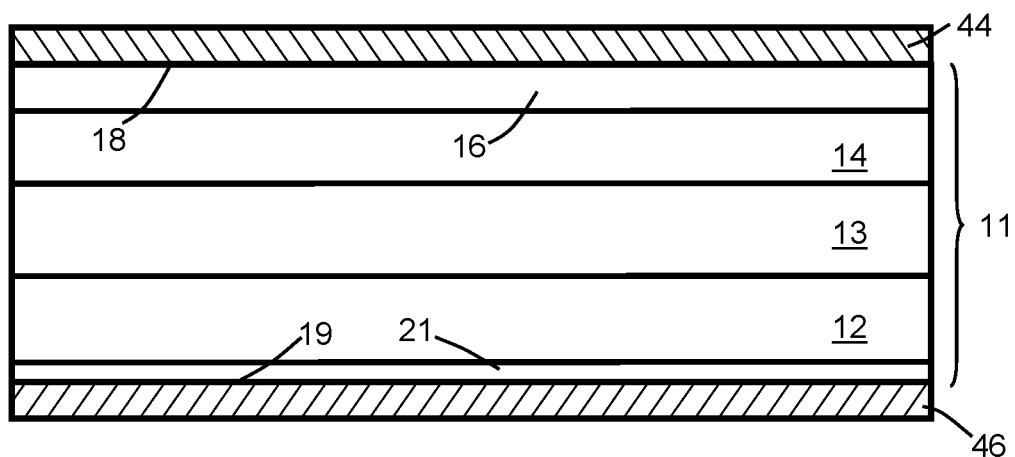

FIG. 8 illustrates semiconductor device 10 after additional processing. In some examples, intermediate semiconductor workpiece 11A is reduced in thickness using a grinding and etching process to remove a lower portion from the back side of semiconductor substrate 12A. This provides charge storage region 12 of semiconductor device 10 in accordance with the present description. In examples, the final target thickness of charge storage region 12 can be in a range from 5 microns to 20 microns. After the thinning process, semiconductor workpiece 11 is provided having bottom side 19. Bottom side 19 can also be referred to as a substrate thinned bottom side. In accordance with the present description, N-type conductivity dopant is provided in or adjacent to bottom side 19 of semiconductor workpiece 11 to provide cathode region 21 of semiconductor device 10. In some examples, ion implantation and annealing techniques are used to form cathode region 21. In some examples, N-type conductivity dopant, such as phosphorous or arsenic is ion implanted at lower energy between about 10 keV and 400 keV and with ion implantation dose between $1.0\times1015$ atoms/cm2 and $5.0\times1016$ atoms/cm2. In some examples, multiple implants at different doses and/or energies can be used. In some examples, laser annealing or other localized heating techniques (that is, techniques that are not harmful to terminal 44) can be used to activate and diffuse the N-type conductivity dopant to form cathode region 21.

Next, terminal 46 can be formed adjacent to bottom side 19 of semiconductor workpiece 11. In some examples, terminal 46 comprises one or more metals or metal layers and the material for terminal 46 can be selected based on the packaging requirements for semiconductor device 10. In some examples, terminal 46 can comprise Al—Ni-vanadium (V)-Au and can be formed evaporation, sputtering, or other deposition techniques as known to one of ordinary skill in the art. In other examples, Ti—Ni—Ag, Al—Ni—Ag, or Cr—Ni—Au can be used. In some examples, terminal 46 has a thickness in a range from about 1 micron to about 4 microns. Terminal 46 provides a cathode contact 24 for semiconductor device 10.

Figure 9:
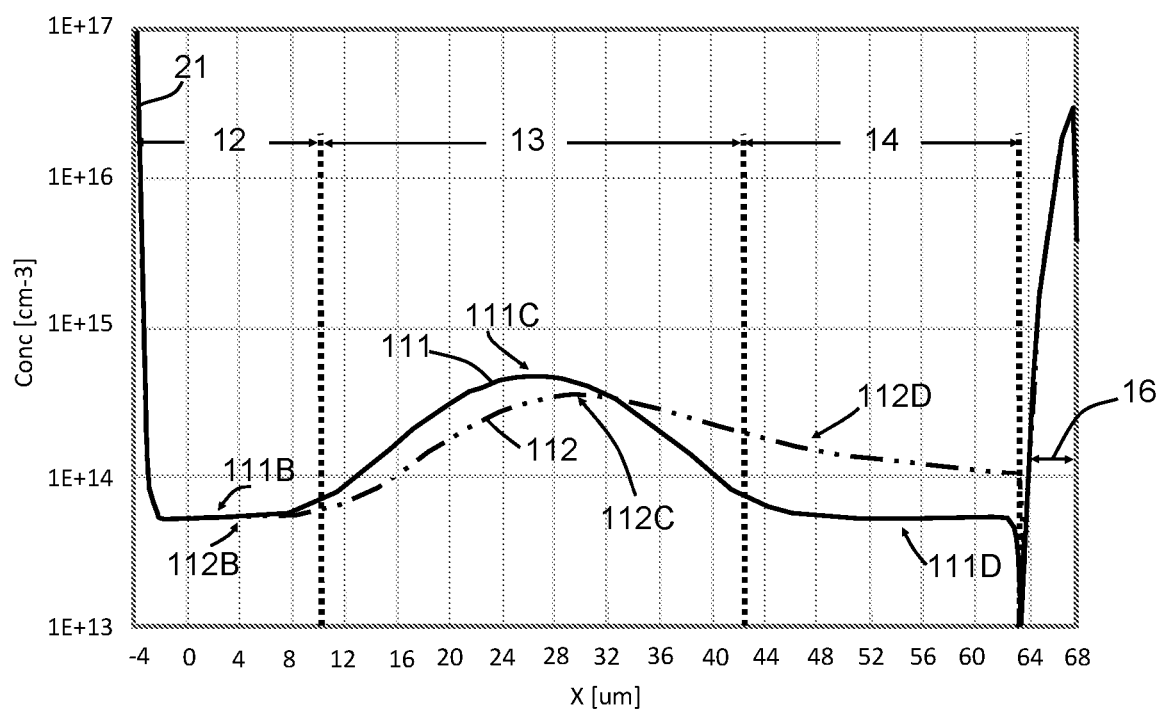
FIG. 9 illustrates graphical information related to dopant concentration profiles and region location of example semiconductor devices in accordance with the present description.

FIG. 9 illustrates graphical information related to dopant concentration profiles and region locations for example semiconductor devices in accordance with the present description, which can be used with semiconductor device 10. FIG. 9 includes dopant concentration profile 111 described previously in FIG. 2 and an alternate dopant concentration profile 112. In addition, FIG. 9 illustrates the approximate location of cathode region 21, charge storage region 12, buffer region 13, drift region 14, and anode region 16 for dopant concentration profiles 111 and 112.

Dopant concentration profile 112 differs in some ways from dopant concentration profile 111. For example, the peak dopant concentration of portion 112C in buffer region 13 of dopant concentration profile 112 is less than the peak dopant concentration of portion 111C in buffer region 13 of dopant concentration profile 111. In addition, the dopant concentration of portion 112D of dopant concentration profile 112 in drift region 14 is greater than the dopant concentration of portion 111D of dopant concentration profile 111 in drift region 14. Further, the dopant concentration of portion 112D of dopant concentration profile 112 in drift portion 14 is greater than the dopant concentration of portion 112B of dopant concentration profile 112 in charge storage region 12. Moreover, the dopant concentration of portion 112D in drift region 14 varies over its thickness. For example, the dopant concentration decreases from the right edge of buffer region 13 towards anode region 16. In some examples, dopant profile 112 is selected for semiconductor device 10 to provide softer switching compared to dopant concentration profile 111.

In some examples and as illustrated in FIG. 9, charge storage region 12 is a high resistivity substrate having a dopant concentration less than about $1.0\times10^{14}$ atoms/cm$^3$, buffer region 13 is a doped region that is ion implanted into the high resistivity substrate and, after undergoing the thermal budget of the process used to make semiconductor device 10, has a peak dopant concentration below $2.0\times10^{15}$ atoms/cm$^3$, and drift region 14 is an epitaxial layer that can have a similar or lower resistivity (i.e., higher dopant concentration) than the substrate used to provide charge storage region 12. In addition, drift region 14 can have a uniform dopant profile as illustrated in dopant concentration profile 111 or can have a non-uniform dopant profile as illustrated in dopant concentration profile 112. FIG. 9 also provides reference for the locations of cathode region 21 and anode region 16 of semiconductor device 10 and representative example dopant concentration profiles.

FIG. 10 illustrates a partial cross-sectional view of a semiconductor device 100 in accordance with the present description. Semiconductor device 100 is similar to semiconductor device 10 and only certain features of semiconductor device 100 will be described. More particularly, semiconductor device 100 includes an example edge termination structure, which can include a portion 161 of anode region 16 extending along top side 18 of semiconductor workpiece 11 below a dielectric 61, such as a field oxide dielectric. A N-type conductive channel stop region 27 is provided at an edge of semiconductor device 100 and can be contacted at top side 18 by a channel stop terminal 47, which can be formed at the same time as terminal 46. A passivation 62 is provided over a portion of terminal 46, dielectric 61 and channel stop terminal 47. In some examples, semiconductor device 100 includes an enhancement region 162 that is P-type conductivity region with a higher dopant concentration than anode region 16 to provide improved ohmic contact to terminal 44.

In some examples, semiconductor device 100 is a high voltage diode that utilizes a high resistivity substrate for charge storage region 12 with selectively doped buffer region 13 and reduced thickness drift region 14 comprising an epitaxial layer as described previously. Among other things, semiconductor device 100 is suitable as a soft recovery high voltage diode to promote high-speed switching with low switching losses in co-packaged IGBT device.

It is understood that although silicon has been described as an example substrate material and the structure formed onto the substrate is described as silicon, the present description is relevant to other materials including other heterojunction semiconductor materials, such as SiGe, SiGeC, GaAs, InGaP, GaN, and AlN, for the various regions.

While the subject matter of the invention is described with specific preferred examples, the foregoing drawings and descriptions thereof depict only typical examples of the subject matter, and are not therefore to be considered limiting of its scope. It is evident that many alternatives and variations will be apparent to those skilled in the art. For example, the conductivity types of the various regions can be reversed. In addition, other edge termination structures can be incorporated. Further semiconductor device 10 can be covered as an etched-mesa semiconductor device.

As the claims hereinafter reflect, inventive aspects may lie in less than all features of a single foregoing disclosed example. Thus, the hereinafter expressed claims are hereby expressly incorporated into this Detailed Description of the Drawings, with each claim standing on its own as a separate example of the invention. Furthermore, while some examples described herein include some but not other features included in other examples, combinations of features of different examples are meant to be within the scope of the invention and meant to form different examples as would be understood by those skilled in the art.

What is claimed is:

1. A semiconductor device, comprising:
   a semiconductor workpiece comprising:
      a semiconductor workpiece top side;
      a semiconductor workpiece bottom side opposite to the semiconductor workpiece top side;
      a first region at the semiconductor workpiece bottom side and having a first conductivity type and a first region dopant concentration;
      a second region adjacent to the first region and having the first conductivity type and a second region dopant concentration, wherein the first region and the second region are part of a semiconductor substrate comprising a resistivity in a range from about 55ohm-cm to about 115 ohm-cm, and wherein the second region dopant concentration is equal to the resistivity of the semiconductor substrate;
      a third region adjacent to the second region and having the first conductivity type and a third region dopant concentration profile over a thickness of the third region with a third region peak dopant concentration less than $2.0 \times 10^{15}$ atoms/cm$^3$; and
      a fourth region having the first conductivity type and a fourth region dopant concentration;
      wherein:
         the fourth region comprises an epitaxial layer over the semiconductor substrate;
         the third region is in a portion of the semiconductor substrate and a portion of the epitaxial layer;
         the third region peak dopant concentration is greater than the second region dopant concentration and the fourth region dopant concentration; and
         the third region peak dopant concentration and the resistivity are selected so that the first region provides a field-stop layer for the semiconductor device;
      a fifth region at the semiconductor workpiece top side adjacent to the fourth region and having a second conductivity type opposite to the first conductivity type;
      a first conductor coupled to the fifth region adjacent to the semiconductor workpiece top side; and
      a second conductor coupled to the first region adjacent to the semiconductor workpiece bottom side.

2. The semiconductor device of claim 1, wherein:
   the third region peak dopant concentration is located at a central portion of the thickness of the third region.

3. The semiconductor device of claim 1, wherein:
   the third region dopant concentration profile has a bell-curve shape across the thickness of the third region; and
   the third region is devoid of proton irradiation.

4. The semiconductor device of claim 1, wherein:
   the semiconductor device further comprises an edge termination structure; and
   the second region and the third region laterally extend underneath the edge termination structure in a cross-sectional view.

5. The semiconductor device of claim 4, wherein:
   the fourth region laterally extends underneath the edge termination structure in the cross-sectional view.

6. The semiconductor device of claim 1, wherein:
   the fourth region dopant concentration is greater than the second region dopant concentration.

7. The semiconductor device of claim 1, wherein:
   the thickness of the third region is in a range from 25 microns to 60 microns.

8. The semiconductor device of claim 1, wherein:
   the third region peak dopant concentration is greater than $1.0 \times 10^{14}$ atoms/cm$^3$ and less than $1.0 \times 10^{15}$ atoms/cm$^3$; and
   the fourth region dopant concentration is less than $1.0 \times 10^{14}$ atoms/cm$^3$ proximate to the third region.

9. The semiconductor device of claim 1, wherein:
   the third region peak dopant concentration is greater than $1.0 \times 10^{14}$ atoms/cm$^3$ and less than $2.0 \times 10^{15}$ atoms/cm$^3$.

10. The semiconductor device of claim 1, wherein:
    the third region comprises an ion implanted region.

11. A semiconductor device, comprising:
    a semiconductor substrate comprising:
       a semiconductor substrate top side;
       a semiconductor substrate bottom side opposite to the semiconductor substrate top side;
       a substrate resistivity from about 55 ohm-cm to about 115 ohm-cm;
       a field-stop layer at the semiconductor substrate bottom side consisting of a cathode region having a first conductivity type and a cathode region dopant concentration; and
       a charge storage region overlying the cathode region and having the first conductivity type and a charge storage region dopant concentration less than the cathode region dopant concentration, wherein the charge storage region dopant concentration is equal to the substrate resistivity;
    a buffer region overlying the charge storage region and having the first conductivity type, a buffer region thickness, a buffer region dopant concentration profile, with a buffer region peak dopant concentration less than $2.0 \times 10^{15}$ atoms/cm$^3$;

a drift region overlying the buffer region and having the first conductivity type and a drift region dopant concentration; and an anode region of a second conductivity type opposite to the first conductivity type adjacent to the drift region; wherein:

the drift region comprises an epitaxial layer over the semiconductor substrate;

the buffer region is in a portion of the semiconductor substrate and a portion of the drift region;

the buffer region peak dopant concentration is greater than the charge storage region dopant concentration and greater than the drift region dopant concentration; and the buffer region peak dopant concentration is spaced apart from the charge storage region and spaced apart from the drift region.

12. The semiconductor device of claim 11, wherein:
the buffer region peak dopant concentration is proximate to a central portion of the buffer region thickness.

13. The semiconductor device of claim 11, further comprising:

an edge termination structure;
wherein:
the charge storage region and the buffer region laterally extend underneath the edge termination structure in a cross-sectional view.

14. The semiconductor device of claim 13, wherein:
the drift region laterally extends underneath the edge termination structure in the cross-sectional view.

15. The semiconductor device of claim 11, wherein:
the buffer region peak dopant concentration is greater than $1.0 \times 10^{14}$ atoms/cm$^3$ and less than $2.0 \times 10^{15}$ atoms/cm$^3$.

16. The semiconductor device of claim 11, wherein:
the buffer region comprises a buffer region dopant concentration profile comprising a bell-curve shape across the buffer region thickness; and
the buffer region is devoid of proton irradiation.

17. A method of manufacturing a semiconductor device, comprising:

providing a semiconductor substrate having a substrate top side, a substrate bottom side opposite to the substrate top side, a first conductivity type, and a substrate resistivity in a range from about 55 ohm-cm to about 115 ohm-cm;

forming a buffer region of the first conductivity type adjacent to the substrate top side;

epitaxially growing a drift region of the first conductivity type over the buffer region;

wherein:
the buffer region has a buffer region thickness, a buffer region dopant concentration profile, and a buffer region peak dopant concentration less than $2.0 \times 10^{15}$ atoms/cm$^3$; and the drift region has a drift region dopant concentration less than the buffer region peak dopant concentration;

forming an anode region of a second conductivity type within the drift region;

removing a portion of the semiconductor substrate from the substrate bottom side to provide a substrate thinned bottom side; and forming a cathode region of the first conductivity type and having a at the substrate thinned bottom side and having a cathode region peak dopant concentration;

wherein:
part of the semiconductor substrate between the cathode region and the buffer region forms a charge storage region that has a charge storage region dopant concentration equal to the substrate resistivity;

the buffer region peak dopant concentration and the substrate resistivity provide the cathode region as a field-stop layer for the semiconductor device; and the buffer region peak dopant concentration is greater than the charge storage region dopant concentration.

18. The method of claim 17, wherein:
the drift region dopant concentration is greater than the charge storage region substrate dopant concentration.

19. The method of claim 17, wherein:
forming the buffer region comprises providing the buffer region dopant concentration profile with a single peak dopant concentration.

20. The method of claim 17, wherein:
forming the buffer region comprises providing the buffer region peak dopant concentration greater than $1.0 \times 10^{14}$ atoms/cm$^3$ and less than $2.0 \times 10^{15}$ atoms/cm$^3$.

* * * * *